United States Patent [19]

Natori

[11] Patent Number: 4,610,003

[45] Date of Patent: Sep. 2, 1986

[54] DYNAMIC TYPE SEMICONDUCTOR MEMORY DEVICE

[75] Inventor: Kenji Natori, Kawasaki, Japan

[73] Assignee: Kabushiki Kaisha Toshiba, Japan

[21] Appl. No.: 646,107

[22] Filed: Aug. 31, 1984

[30] Foreign Application Priority Data

Sep. 2, 1983 [JP] Japan ................................ 58-161464

[51] Int. Cl.[4] .......................... G11C 7/00; H03K 3/01
[52] U.S. Cl. .................................... 365/228; 365/222; 307/296 A
[58] Field of Search .................. 365/149, 45, 222, 228, 365/174; 307/296 A, 577, 578, 579

[56] References Cited

U.S. PATENT DOCUMENTS

| 3,806,741 | 4/1974 | Smith | 307/304 |
| 4,347,448 | 8/1982 | Plachno | 307/578 |
| 4,399,519 | 8/1983 | Masuda et al. | 365/149 |

OTHER PUBLICATIONS

Dennard et al., "Design of Ion-Implanted MOSFET's with Very Small Physical Dimensions," IEEE Journal of Solid-State Circuits, vol. SC-19, No. 5, pp. 256-267, Oct. 1974.

Primary Examiner—Terrell W. Fears
Assistant Examiner—Guy M. Miller
Attorney, Agent, or Firm—Finnegan, Henderson, Farabow, Garrett & Dunner

[57] ABSTRACT

A dynamic type semiconductor memory device includes a memory cell having a capacitor for storing an amount of charge corresponding to data and, an n-channel MOS transistor to control charging and discharging to and from the capacitor, and a control unit to permit a read/write operation of the memory cell. The control unit of the memory device includes a drive circuit for generating turn on and turn off voltages, a charge pump circuit connected to the gate of the memory cell, and a switching element connected between the drive circuit and the gate of the MOS transistor.

17 Claims, 7 Drawing Figures

DYNAMIC TYPE SEMICONDUCTOR MEMORY DEVICE

BACKGROUND OF THE INVENTION

The present invention relates to a dynamic type semiconductor memory device and, more particularly, to a dynamic type semiconductor memory device manufactured with a very high integration density.

The improvement of the recent dynamic type semiconductor memory device is remarkable in integration density. In a general dynamic type semiconductor memory device, memory cells are arranged on a semiconductor memory chip in a matrix array. Data is read out of and written into memory cells through bit lines. Word lines each supply to the memory cells an enable signal to permit the read and write operations of data. A known memory cell 10 shown in FIG. 1 includes a capacitor 12 for storing an amount of charge corresponding to data, i.e. binary "1" or "0", and a transfer gate for controlling the charging and discharging to and from the capacitor 12. The transfer gate is formed of an enhancement type n-channel MOS transistor 14. A word line 16 is connected to the gate of the MOS transistor 14, while a bit line 18 is connected to the capacitor 10 via a current path of the MOS transistor 14.

For writing data into the memory cell 10, a high level voltage, e.g. +5 V, as shown in FIG. 2, is supplied to the word line 16 in order to turn on the MOS transistor 14. During a period that the MOS transistor 14 is conductive, an amount of charge corresponding to data is stored in the capacitor 12 through the bit line 18. After charging and discharging to and from the capacitor 12, the word line 16 is supplied with a low level voltage, i.e. 0 V as shown in FIG. 2, in order to turn off the MOS transistor 14.

For reading out data, charge stored in the capacitor 12 is transferred to the bit line 18 during a period that the MOS transistor 14 is conductive.

In manufacturing the dynamic memory of 1 M bits, for example, the MOS transistors in the memory cells must be designed to be extremely short in channel length. If so designed, the charges stored in the capacitor 12 are easy to move out of the capacitor even if the MOS transistor 14 is in an off state. Therefore, it is very difficult for the memory cell to hold data for a long time. This indicates that, in the dynamic type semiconductor memory device with such a structure, the refreshing interval for the memory cells must be shorter, as an integration density of the memory device is improved. Conversely, if the refreshing interval is fixed, the memory device is greatly restricted in increasing the integration density.

SUMMARY OF THE INVENTION

Accordingly, an object of the present invention is to provide a dynamic type semiconductor memory device of which the data holding time is not reduced even if the integration density is increased.

According to the present invention, there is provided a dynamic type semiconductor memory device comprising at least one memory cell including a capacitor for storing an amount of charge corresponding to data and a first MOS transistor for controlling charging and discharging to and from the capacitor, a drive circuit for selectively generating turn on and first turn off voltages, a leak control section for generating a second turn off voltage, an absolute value of a difference between the second turn off voltage and the turn on voltage being larger than that of a difference between the first turn off voltage and the turn on voltage, and voltage supplying circuit for selectively supplying the turn on voltage from the drive circuit and the second turn off voltage from the leak control section to the gate of the first MOS transistor in accordance with the first turn off voltage.

DETAILED DESCRIPTION OF THE PREFERRED EMBODIMENTS

Figure 1:
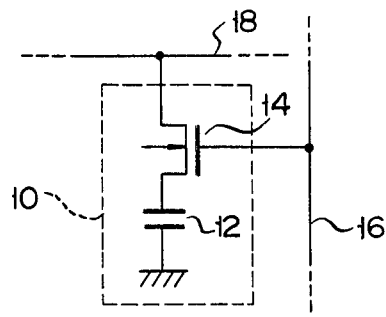
FIG. 1 shows a circuit diagram of a known dynamic type semiconductor memory device.
Figure 2:
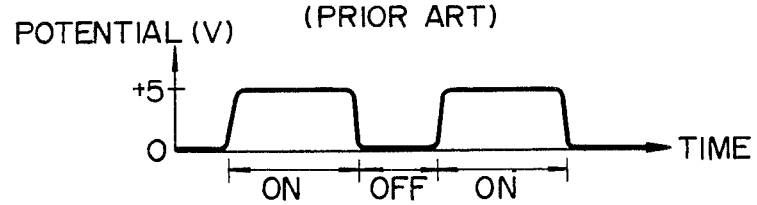
FIG. 2 shows a voltage supplied through a word line to a MOS transistor in a memory cell shown in FIG. 1.
Figure 3:
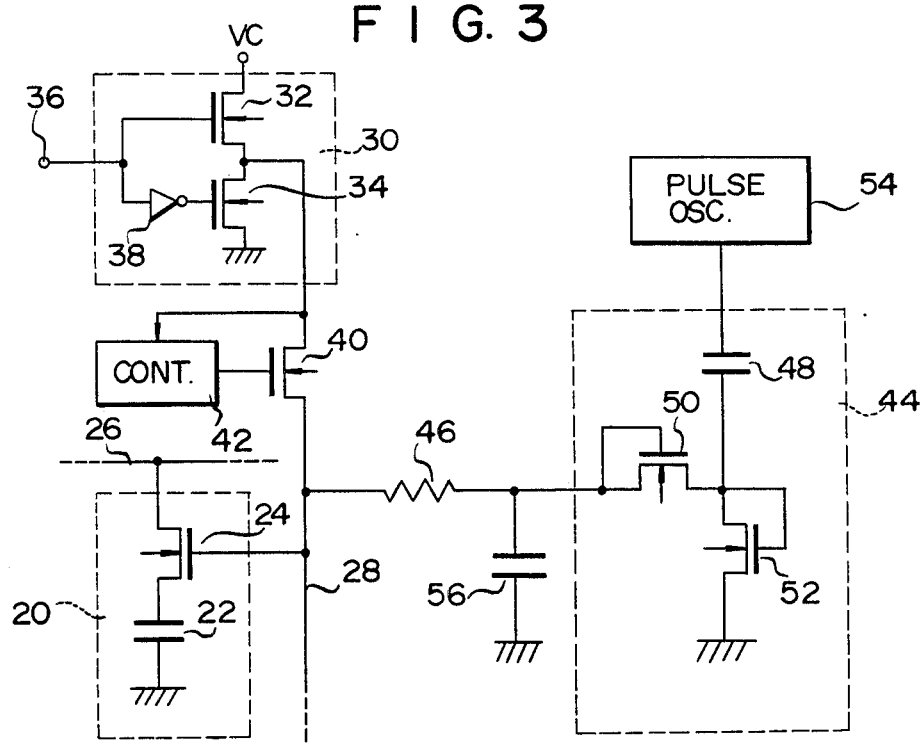
FIG. 3 is a circuit diagram of a dynamic type semiconductor memory device which is an embodiment of the present invention.
Figure 4:
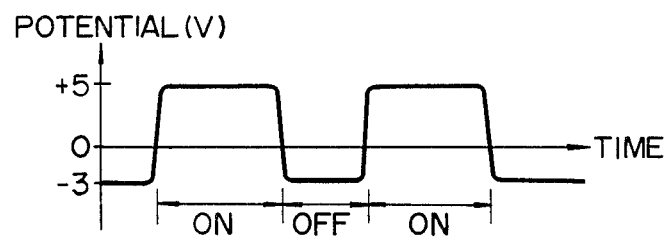
FIG. 4 shows a voltage supplied through a word line to the MOS transistor in a memory cell shown in FIG. 3.

In FIG. 3, there is illustrated an embodiment of a dynamic type semiconductor memory device according to the present invention. The dynamic type semiconductor memory device is so designed that a memory capacity thereof for logic data storage is 1 M bits, 4 M bits or more, and a great number of memory cells are arrayed on a semiconductor chip in a matrix fashion. FIG. 3 shows a memory cell 20 capable of storing data of 1 bit, and a control unit for permitting the memory cells of one word to effect the read and write operations, this one word memory cells containing the memory cell 20.

The memory cell 20 is made up of a capacitor 22 for storing an amount of charge corresponding to a logic value of data, and an n-channel MOS transistor 24 for controlling the charging and discharging to and from the capacitor 22. The capacitor 22 is connected at one end to a bit line 26 via a current path of an n-channel MOS transistor 24. The other end of the capacitor 22 is grounded. The n-channel MOS transistor 24 is connected at the gate to a word line 28. The control unit contains a drive circuit 30 which generates, in response to a control signal such as an address signal, either a turn on voltage, e.g. 5 V, or a first turn off voltage, e.g. 0 V, for the n-channel MOS transistor 24. The drive circuit 30 contains a couple of n-channel MOS transistors 32 and 34, for example. A current path of the n-channel MOS transistor 32 is connected at one end to a source potential terminal VC set at +5 V, for example, and at the other end grounded via a current path of the n-channel MOS transistor 34. The gate of the n-channel MOS transistor 32 is directly connected to a control terminal 36 supplied with the control signal, while the gate of the n-channel MOS transistor 34 is connected to the control terminal 36 by way of an inverter 38. The word line 28 is connected to a junction between the MOS transistors 32 and 34 through a current path of a switching element, for example, an n-channel MOS transistor 40. The junction is also connected to a switching controller 42 which generates positive and negative voltages respectively to render the n-channel MOS transistor 40 conductive and nonconductive. The switching controller 42 is so designed as to produce a positive voltage in response to the turn on voltage from the drive circuit 30, and further to produce a negative voltage, with a delay time, in response to the turn off voltage. The delay time corresponds to a period from an instant when the output signal of the drive circuit 30 is changed from the turn on voltage to the first turn off voltage till the time when the potential on the word line 28 is set at 0 V through the n-channel MOS transistor 40.

The control unit of the memory device has a charge pump circuit 44 for generating a second turn off voltage, e.g., −3 V. An absolute value of a difference between the turn on voltage and the second turn off voltage is larger than that of a difference between the turn on voltage and the first turn off voltage. The charge pump circuit 44 changes the gate voltage of the n-channel MOS transistor 24 from 0 V to −3 V, after the n-channel MOS transistor 40 is nonconductive. To this end, the charge pump circuit 44 is connected to the word line 28, through a resistor 46 of large resistance 46, for example. The charge pump circuit 44 contains a capacitor 48, and n-channel MOS transistors 50 and 52. The word line 28 is grounded through the resistor 46, a current path of the MOS transistor 50, and that of the MOS transistor 52 in this order. The gates of the MOS transistors 50 and 52 are connected to the sources thereof, respectively. One end of the capacitor 48 is connected to the drain of the MOS transistor 50 and the source of the MOS transistor 52. The other end of the capacitor 48 is connected to the output terminal of a pulse oscillator 54 for generating pulses at a predetermined frequency. To stabilize the voltage, a capacitor 56 is connected to a series connection of the current paths of the MOS transistors 50 and 52.

The operation of the dynamic type semiconductor memory device thus arranged will be given referring to FIG. 5. For permitting the read/write operation of the memory cell 20, for example, a control signal, which causes the drive circuit 30 to generate a turn on voltage with a duration longer than the charge and discharge periods of the capacitor 22, is supplied to the control terminal 36. Upon receipt of the control signal, the drive circuit 30 produces such a turn on voltage, which in turn is applied to the switching controller 42. Immediately, the switching controller 42 responds to the turn on voltage to render the n-channel MOS transistor 40 conductive. Then, the turn on voltage is supplied from the drive circuit 30 to the gate of the n-channel MOS transistor 24 of the memory cell 20, via the n-channel MOS transistor 40 and the word line 28. The turn on voltage makes the n-channel MOS transistor 24 conductive. In a write mode, the capacitor 22 of the memory cell 20 receives an amount of charge corresponding to a logic value of data from the bit line 26, through the n-channel MOS transistor 24. In a read out mode, the charge stored in the capacitor 22 is discharged through the n-channel MOS transistor 24 to the bit line 26.

During this period, the charge pump circuit 44 responds to the output pulses from the pulse oscillator 54 to periodically discharge the charge on the word line 28 to ground. In this case, a current flowing into the charge pump circuit 44 is limited to a relatively small value by the resistor 46. As described above, when the n-channel MOS transistor 40 is conductive, the charge corresponding in amount to the discharged one from the word line 28 through the charge pump circuit 44 is supplementarily supplied to the word line 28, via the n-channel MOS transistor 40. Therefore, negligible is an influence of the charge pump circuit 44 upon the drop in the gate voltage of the n-channel MOS transistor 24 in the memory cell 20.

After completion of the read/write operation of the memory cell 20, the drive circuit 30 generates the first turn off voltage, i.e. 0 V, according to the control signal. Immediately, the first turn off voltage is supplied to the gate of the n-channel MOS transistor 24 of the memory cell 20, through the n-channel MOS transistor 40 and the word line 28, thereby to turn off the n-channel MOS transistor 24. At this time, the memory cell 20 is in a stand-by mode where the charge and discharge for the capacitor 22 are disabled. On the other hand, the first turn off voltage is also supplied to the switching controller 42. The switching controller 42 generates a negative voltage not immediately after reception of the first turn off voltage, but after the memory cell 20 is in the stand-by state. The negative voltage turns off the n-channel MOS transistor 40. Under this condition, the charge from the drive circuit 30 is blocked by the n-channel MOS transistor 40. The charge pump circuit 44 continuously discharges the charge on the word line 28 to ground till the gate voltage of the n-channel MOS transistor 24 reduces from 0 V to −3 V.

Figure 5:
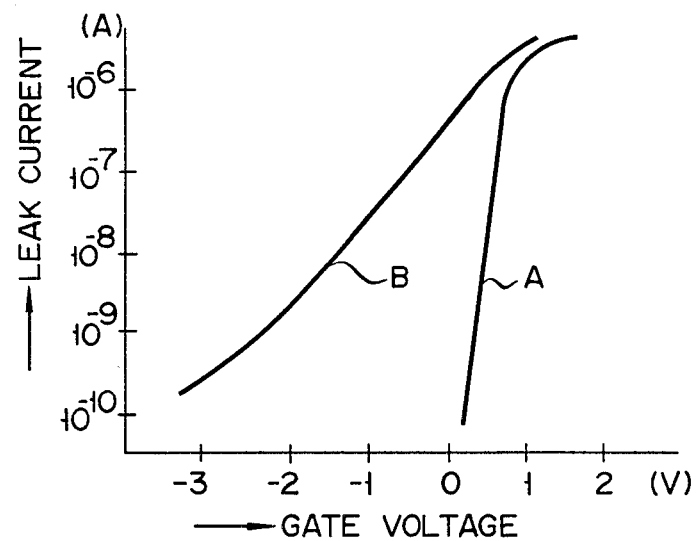
FIG. 5 shows a graph representing a cut-off characteristic of an n-channel MOS transistor, with a parameter being the size of the MOS transistor.

FIG. 5 graphically illustrates a characteristic of a leak current between the source and the drain of the n-channel MOS transistor 24. If an integration density of the memory device is relatively low, the n-channel MOS transistor 24 exhibits a leak current characteristic as indicated by a curve A. In this case, the leak current between the source and the drain can be kept at a satisfactorily small value, e.g., $10^{-10}$ by the first turn off voltage, i.e. 0 V, derived from the drive circuit 30. In the memory device with such a high integration density in the present embodiment, however, the channel length of the MOS transistor 24 is very short and exhibits a leak current characteristic as indicated by a curve B. When the n-channel MOS transistor 24 is turned off only by the first turn off voltage (0 V) from the drive circuit 30, current of $10^{-7}$ A or more may leak between the source and the drain of the n-channel MOS transistor 24.

In the present embodiment, when the n-channel MOS transistor 24 is turned off, the charge pump circuit 44 reduces the gate voltage of the n-channel MOS transistor 24 up to a second turn off voltage (i.e. −3 V) to set up a sufficient insulation between the source and the drain of the n-channel MOS transistor 24. Such second turn off voltage is derived from the charateristic curve B shown in FIG. 5. Therefore, it takes a long time for the charge stored in the capacitor 22 to discharge through the n-channel MOS transistor 24, thereby to allow the memory cell to hold data for a long time. This fact implies that a dynamic type semiconductor memory device can be manufactured to have a number of minute memory cells without shortening the data refresh cycles.

Figure 7:
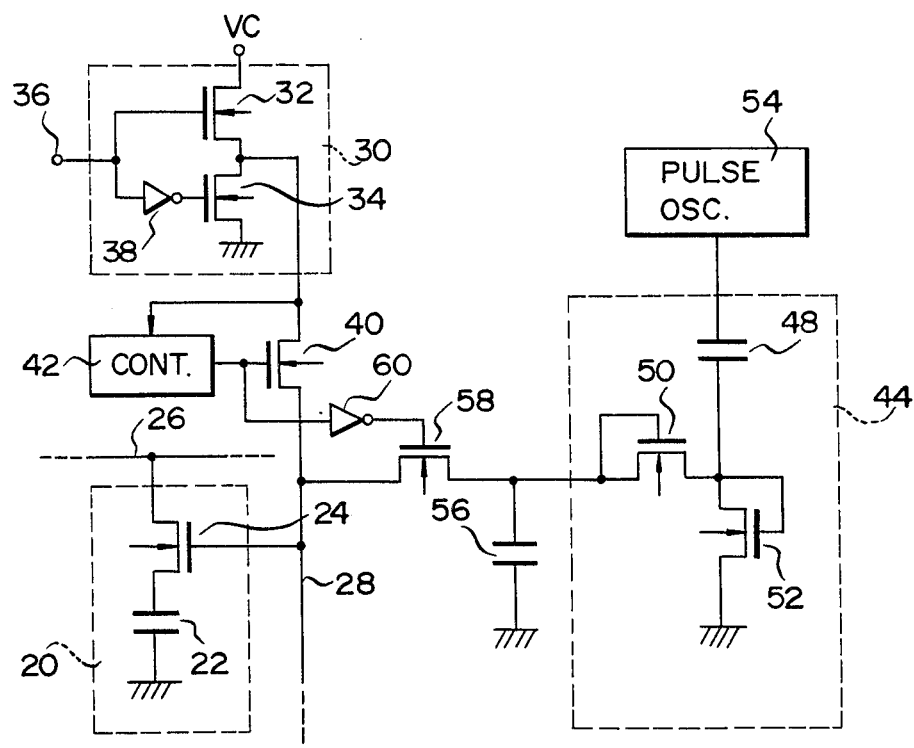
FIG. 7 shows a circuit diagram of a dynamic type semiconductor memory device which is a further embodiment of the present invention, but is similar to that of FIG. 3.

It should be understood that the present invention is not limited to the above-mentioned embodiment, but may be changed and modified in various ways. For example, in the memory device shown in FIG. 3, the resistor 46 is connected between the word line 28 and the charge pump circuit 44. The resistor 46 may be replaced by a switching element, e.g., an n-channel MOS transistor 58, as shown in FIG. 7. In this case, the MOS transistor 58 is so controlled that it is nonconductive when the n-channel MOS transistor 40 is conductive and conductive when the n-channel MOS transistor 40 is nonconductive. The output terminal of the switching controller 42 is connected to the gate of the MOS transistor 58 through an inverter 60. In FIG. 7, like reference numerals are used for designating like or equivalent portions in FIG. 3. Further, the inverter 60 may be replaced by connecting to the gate of the MOS transistor 58 a switching controller which makes the MOS transistor 58 conductive when the n-channel MOS transistor 40 is conductive for a long time, that is, none of the memory cells in the memory device are accessed.

Figure 6:
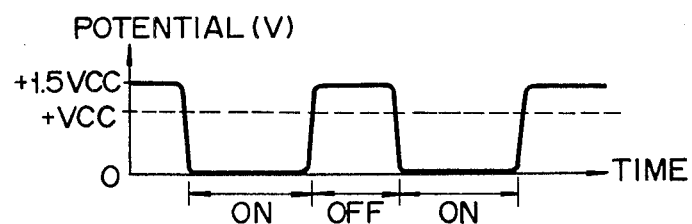
FIG. 6 shows a voltage supplied to a MOS transistor in a memory cell in a dynamic type semiconductor memory device as another embodiment of the present invention.

While in the above-mentioned embodiment the MOS transistor 24 provided in the memory cell 20 is of the n-channel type, it may be replaced by a p-channel MOS transistor. In this case, to secure the operation shown in FIG. 6, the drive circuit 30 is so designed as to generate a voltage at ground level (0 V) for turning on that MOS transistor and a positive voltage +Vcc for turning off the MOS transistor. Additionally, the charge pump circuit 44 is designed such that it sets on the word line 28 a potential approximately 1.5 times the positive voltage +Vcc. Specifically, the word line 28 is connected to a source potential terminal which is set at the positive potential +Vcc through a route of the resistor 46 or a switching element, and the current paths of the MOS transistors 50 and 52 in this order.

While in the above-mentioned embodiment the memory cell 20 is made up of one capacitor 22 and one MOS transistor 24, it may be made up of one capacitor and three MOS transistors.

The charge pump circuit 44 may be formed electrically, separated from a charge pump circuit formed on the same semiconductor chip for another purposes.

As seen from the foregoing description, in the dynamic type semiconductor memory device according to the present invention, after the MOS transistor in the memory cell is turned off by the first turn off voltage from the drive circuit, the charge pump circuit, in place of the drive circuit, supplies to the gate of the MOS transistor the second turn off voltage capable of satisfactorily reducing the leak current between the source and drain of the MOS transistor. With this feature, even if the source-drain leak current characteristic of the MOS transistor is deteriorated due to the microminiaturization of the memory device elements, the capacitor in the memory cell can hold an amount of charge corresponding to data for a long time. In other words, an integration density of the dynamic type semiconductor memory device can be increased independent of the memory refresh cycle.

What is claimed is:

1. A dynamic type semiconductor memory device comprising:
   at least one memory cell including capacitive means for storing an amount of charge corresponding to data and a MOS transistor for controlling charging and discharging to and from said capacitive means;
   drive means for selectively generating turn on and first turnoff votages;
   leak control means for generating a second turn off voltage, an absolute value of a difference between the second turn off voltage and the turn on voltage being larger than that of a difference between the first turn off voltage and the turn on voltage; and
   voltage supplying means including a large impedance element connected between said leak control means and the gate of said MOS transistor, a switching element connected between said drive means and the gate of said MOS transistor, and a switching controller which makes said switching element nonconductive in response to the first turn off voltage with a delay time and conductive in response to the turn on voltage.

2. A dynamic type semiconductor memory device according to claim 1, wherein said large impedance element is a resistor having a large resistance.

3. A dynamic type semiconductor memory device according to claim 1, wherein said switching element is formed of a MOS transistor.

4. A dynamic type semiconductor memory device according to claim 1, wherein said drive means has a drive circuit which selectively generates either the turn on voltage or the first turn off voltage in accordance with a control signal.

5. A dynamic type semiconductor memory device according to claim 1, wherein said MOS transistor is on n-channel type.

6. A dynamic type semiconductor memory device according to claim 5, wherein said leak control means includes a pulse oscillator, and a charge pump circuit which generates the second turn off voltage in cooperation with said pulse oscillator, said second turn off voltage being lower than the first turn off voltage.

7. A dynamic type semiconductor memory device according to claim 1, wherein said MOS transistor is of p-channel type.

8. A dynamic type conductor memory device according to claim 7, wherein said leak control means includes a pulse oscillator, and a charge pump circuit which generates the second turn off voltage in cooperation with said pulse oscillator, said second turn off voltage being higher than the first turn off voltage.

9. A dynamic type semiconductor memory device comprising:
   at least one memory cell including capacitive means for storing an amount of charge corresponding to data and a MOS transistor for controlling charging and discharging to and from said capacitive means;
   drive means for selectively generating generating turn on and first turn off voltages;
   leak control means for generating a second turn off voltage, an absolute value of a difference between the second turn off voltage and the turn of voltage being larger than that of a difference between the first turn off voltage and the turn on voltage; and
   voltage supplying means including a first switching element connected between said leak control menas and the gate of said MOS transistor, a second switching element connected between said drive means and the gate of said MOS transistor, and a switching controller which makes said first and second switching elements conductive and nonconductive in response to the first turn off voltage, respectively, and rendering said first and second switching elements nonconductive and conductive in response to the turn on voltage.

10. A dynamic type semiconductor memory device according to claim 9, wherein said first and second switching elements are MOS transistors.

11. A dynamic type semiconductor memory device according to claim 9, wherein said drive means has a drive circuit which selectively generates either the turn on voltage or the first turn off voltage in accordance with a control signal.

12. A dynamic type semiconductor memory device according to claim 9, wherein said MOS transistor is of n-channel type.

13. A dynamic type semiconductor memory device according to claim 12, wherein said leak control means includes a pulse oscillator, and a charge pump circuit which generates the second turn off voltage in cooperation with said pulse oscillator, said second turn off voltage being lower than the first turn off voltage.

14. A dynamic type semiconductor memory device according to claim 9, wherein said first MOS transistor is of p-channel type.

15. A dynamic type semiconductor memory device according to claim 14, wherein said leak control means includes a pulse oscillator, and a charge pump circuit which generates the second turn off voltage in cooperation with said pulse oscillator, said second turn off voltage being higher than the first turn off voltage.

16. A dynamic type semiconductor memory device comprising:
at least one memory cell including capacitive means for storing an amount of charge corresponding to data and a MOS transistor for controlling charging and discharging to and from said capacitive means;
drive means for selectively generating turn on and first turn off voltages;
leak control means for generating a second turn off voltage, an absolute value of a difference between the second turn off voltage and the turn on voltage being larger than that of a difference between the first turn off voltage and the turn on voltage; and
voltage supplying means including a large impedance element connected between said leak control means and the gate of said MOS transistor, a switching element connected between said drive means and the gate of said MOS transistor, and a switching controller which controls the conduction state of said switching element in accordance with an enable signal.

17. A dynamic type semiconductor memory device comprising:
at least one memory cell including capacitive means for storing an amount of charge corresponding to data and a MOS transistor for controlling charging and discharging to and from said capacitive means;
drive means for selectively generating turn on and first turn off voltages;
leak control means for generating a second turn off voltage, an absolute value of a difference between the second turn off voltage and the turn on voltage being larger than that of a difference between the first turn off voltage and the turn on voltage; and
voltage supplying means including a first switching element connected between said leak control means and the gate of said MOS transistor, a second switching element connected between said drive means and the gate of said MOS transistor, and a switching controller which makes one of said first and second switching elements conductive and the other of said first and second switching elements nonconductive in response to an enable signal.

* * * * *

UNITED STATES PATENT AND TRADEMARK OFFICE
CERTIFICATE OF CORRECTION

PATENT NO. : 4,610,003

DATED : September 2, 1986

INVENTOR(S) : Kenji Natori

It is certified that error appears in the above-identified patent and that said Letters Patent is hereby corrected as shown below:

Column 6, line 30, "on" should be -- of --.

Signed and Sealed this

Tenth Day of March, 1987

Attest:

DONALD J. QUIGG

Attesting Officer

Commissioner of Patents and Trademarks